United States Patent

Hsueh et al.

[11] Patent Number: 5,981,356
[45] Date of Patent: Nov. 9, 1999

[54] ISOLATION TRENCHES WITH PROTECTED CORNERS

[75] Inventors: Cheng-Chen Calvin Hsueh, Taipei, Taiwan; Chu-Tsao Yen, Fremont, Calif.

[73] Assignee: Integrated Device Technology, Inc., Santa Clara, Calif.

[21] Appl. No.: 08/901,574

[22] Filed: Jul. 28, 1997

[51] Int. Cl.[6] .................................................. H01L 21/76
[52] U.S. Cl. ........................ 438/424; 438/435; 438/437; 148/DIG. 50
[58] Field of Search ..................................... 438/424, 427, 438/435, 428, 437, 433; 148/DIG. 50

[56] References Cited

U.S. PATENT DOCUMENTS

| | | |
|---|---|---|
| 4,923,821 | 5/1990 | Namose . |
| 5,350,941 | 9/1994 | Madan . |
| 5,433,794 | 7/1995 | Fazan et al. . |
| 5,521,422 | 5/1996 | Mandelman et al. . |
| 5,567,270 | 10/1996 | Liu . |
| 5,578,518 | 11/1996 | Koike et al. . |
| 5,643,822 | 7/1997 | Furukawa et al. . |
| 5,677,229 | 10/1997 | Morita et al. ............................. 438/433 |
| 5,712,185 | 1/1998 | Tsai et al. ................................ 438/424 |
| 5,766,823 | 6/1998 | Fumitomo ................................ 438/437 |
| 5,801,083 | 9/1998 | Yu et al. ........................... 148/DIG. 50 |
| 5,834,358 | 11/1998 | Pan et al. ................................ 438/424 |

*Primary Examiner*—Trung Dang
*Attorney, Agent, or Firm*—Isabelle R. McAndrews

[57] ABSTRACT

A method for forming trench isolation with spacers on the corners where the silicon and oxide intercept. A cavity is formed in silicon with a mask. Prior to completely removing the mask, the mask is further etched to enlarge the upper portion of the cavity. The cavity is filled with oxide, which is subsequently etched to produce a dome-shaped cap, protective of sharp silicon corners that would otherwise upset electrical characteristics of transistors.

18 Claims, 5 Drawing Sheets

2

ISOLATION TRENCHES WITH PROTECTED CORNERS

FIELD OF THE INVENTION

The invention provides a method for protecting silicon corners with oxide.

BACKGROUND OF THE INVENTION

Shallow trench isolation (STI) is gaining acceptance as the dominant transistor isolation process for the submicron generation. One of the drawbacks of STI is the sharp corners at the isolation edge where the silicon substrate and oxide intercept. One option is to minimize the exposure of silicon corners. Exposed silicon corners will upset the electrical characteristics of a transistor device. U.S. Pat. No. 5,433,794, incorporated by reference herein, discusses one method for protecting silicon corners in an STI process.

SUMMARY OF THE INVENTION

The present invention relates to a process for forming a trench with spacers surrounding trench corners. The process involves forming a cavity with a mask, removing a portion of the mask to enlarge the cavity and filling the cavity with an oxide. Then the oxide is planarized, and thereafter wet or dry etched, or both, to form a spacer.

BRIEF DESCRIPTION OF THE DRAWINGS

A few embodiments of the invention may be better understood by referring to the drawings briefly described below.

DETAILED DESCRIPTION OF THE INVENTION

Figure 1:
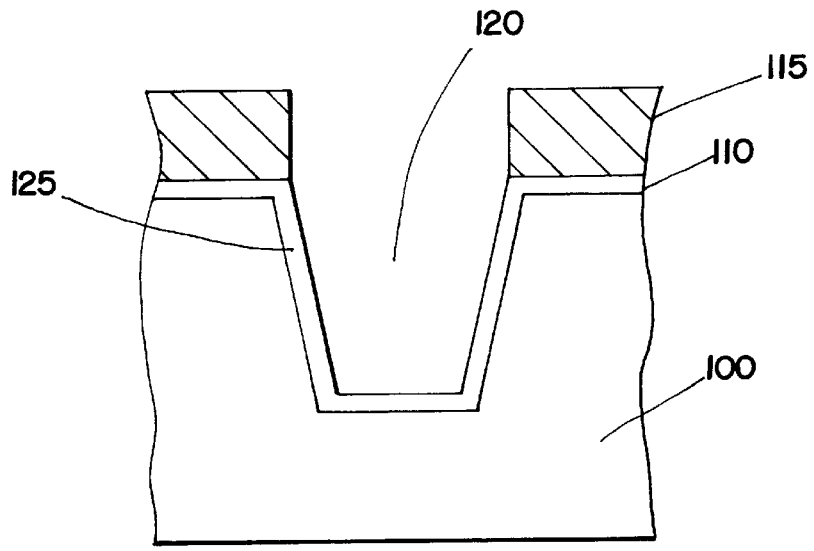
FIG. 1 illustrates in cross-section a trench formed in a substrate.

FIG. 1 illustrates a trench formed by providing a pad oxide layer 110 on the surface of a substrate 100, and then a patterning layer 115 above the pad oxide. The pad oxide consists of a thick layer of oxide 110 grown to a thickness ranging from approximately 100Å–100Å. The patterning layer may consist of several layers of material or of a single layer of silicon nitride (hereinafter nitride) and have a thickness of 1000–2500Å. In a preferred embodiment, the nitride layer serves as the patterning layer to define the location of the trench. The nitride layer 115, pad oxide 110 and a portion of the silicon substrate are etched to form the trench 120 and mask sections 115A and 115B. Thereafter, an oxide is grown in the trench to form an oxide liner 125 on the interior of the trench.

Figure 2:
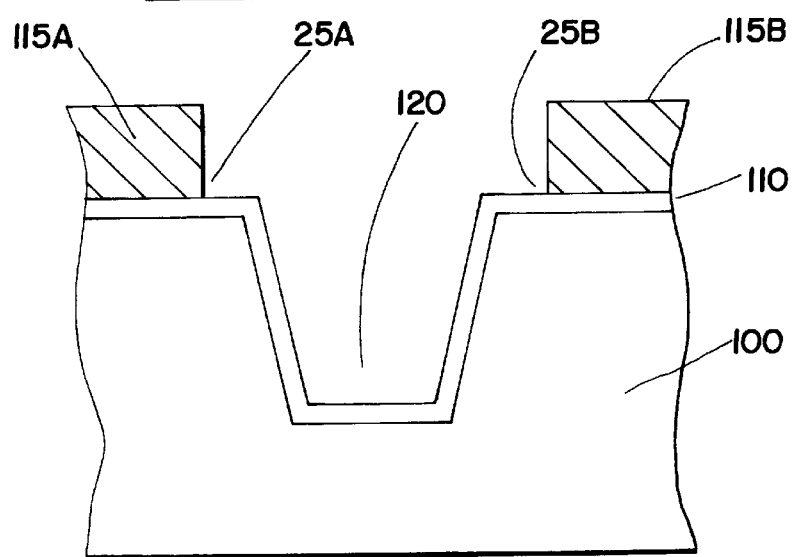
FIG. 2 is a cross-section of a trench having a step.

Subsequently, as shown in FIG. 2, mask sections 115A and 115B above the trench are wet etched using $H_3PO_4$ at 165° C. to form steps 25A and 25B. Approximately 500–800Å of a length dimension is removed from mask section 115A and from mask section 115B in forming step 25A and step 25B. $H_3PO_4$ has a minimal effect on the pad oxide layer 110.

Figure 3:
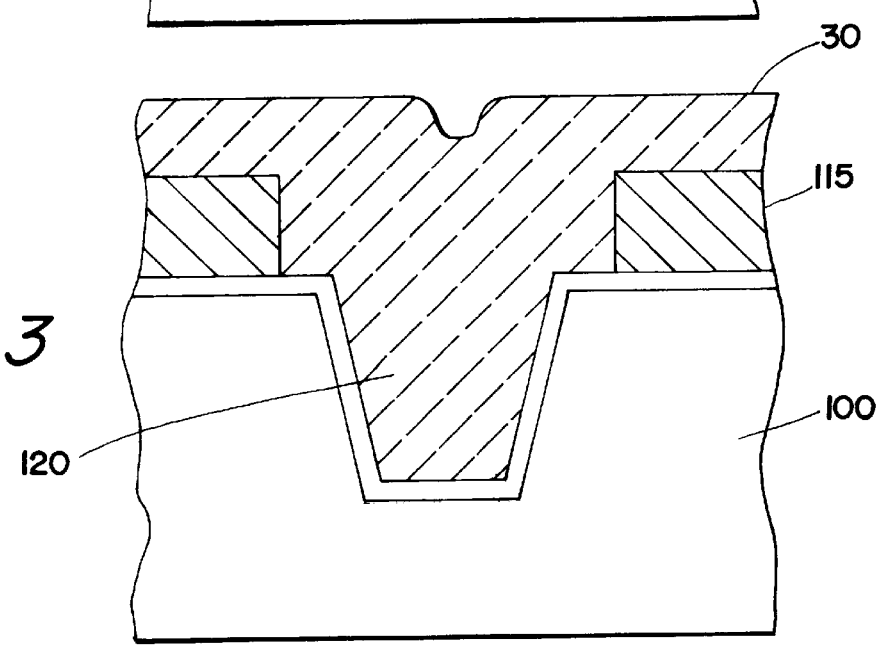
FIG. 3 is a cross-section of an insulating material provided within the cavity formed by the trench and the step.
Figure 4:
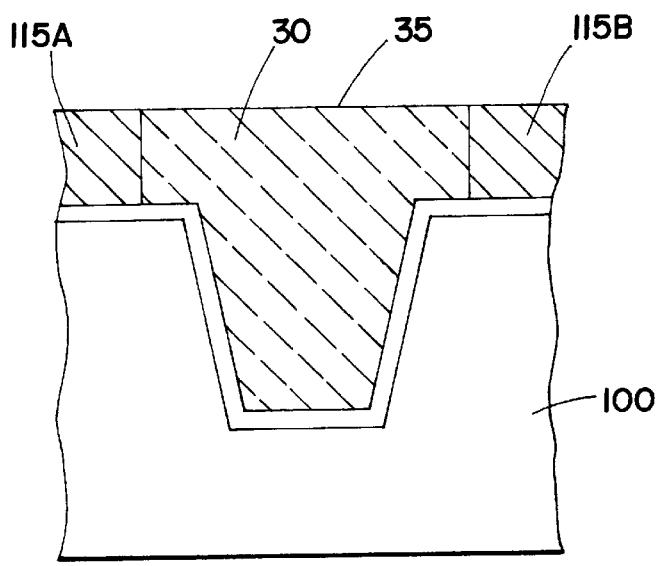
FIG. 4 illustrates in cross-section the structure of FIG. 3, after the insulating layer is planarized.

The trench 120 is filled with an insulating layer of TEOS or $SiO_2$. Insulating layer 30 is provided within the trench cavity. Insulating layer contacts mask sections (115A and 115B) and oxide liner 125 as shown in FIG. 3. The insulating layer may be deposited using low pressure chemical vapor deposition (LPCVD) at a temperature range of 300 to 850° C. Alternatively, the insulating layer may be deposited using a high density plasma CVD oxide or ozone TEOS. An optional high temperature anneal may be performed to density the oxide. In a preferred embodiment the annealing is performed between approximately 800° C. and 1200° C. The thickness of insulating layer 30 is then reduced in a conventional manner with either an etchant or through planarization. FIG. 4 illustrates the appearance of the insulating layer after modification, in which its upper surface 35 is coplanar with the mask sections 115A and 1155B. The planarization is generally performed using chemical mechanical polishing.

Figure 5:
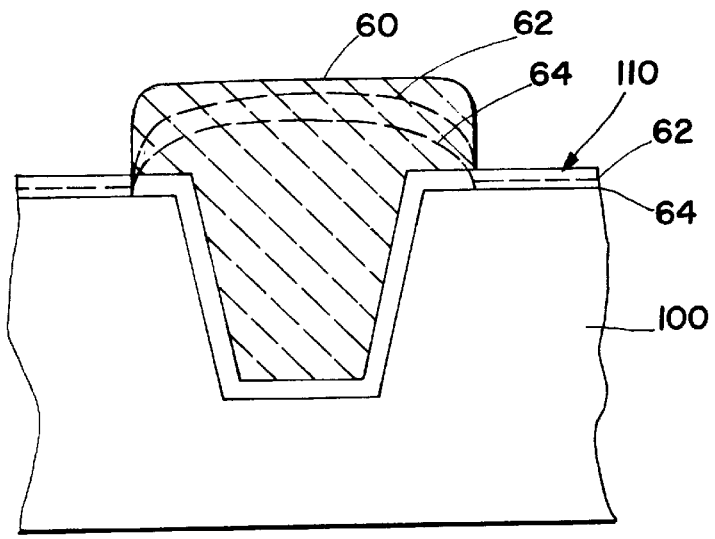
FIG. 5 is a cross-section of the oxide within the cavity after mask sections have been removed.

Mask sections 115A and 115B are then removed resulting in the structure of FIG. 5. The mask sections may be stripped with an acid, such as $H_3PO_4$ at 165° C. Thereafter oxide 60 is reshaped by either dry etching or wet etching or a combination thereof.

Figure 6A:
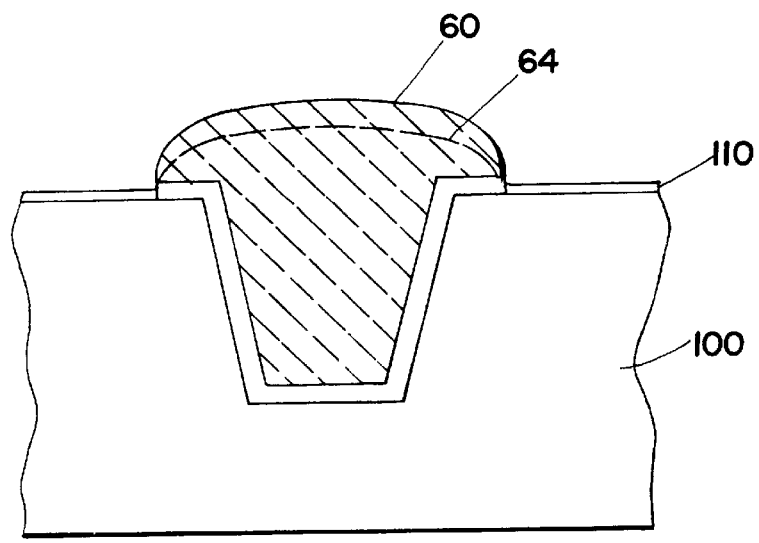
FIG. 6A illustrates in cross-section the structure that results after a dry etching is performed.

If a dry etching step, such as argon sputtering, is used to reshape oxide 60, the top corner areas will etch faster than the sides of oxide 60 to remove the oxide above line 62 in FIG. 5. This dry etching step forms spacers at each side of oxide 60. In particular, removing oxide above line 62 forms slightly sloping sides, to yield the structure shown in FIG. 6A. During wet etching, oxide 60 is exposed to a solution of diluted 10:1 HF or diluted 100:1 HF at between a temperature range of approximately 23° C. and 25° C. Oxide 110, because it was thermally grown, is removed at an etch rate of 282 to 318Å/min by the HF etchant. Whereas oxide 60 deposited within the trench will etch faster than the thermally-grown oxide.

Figure 6B:
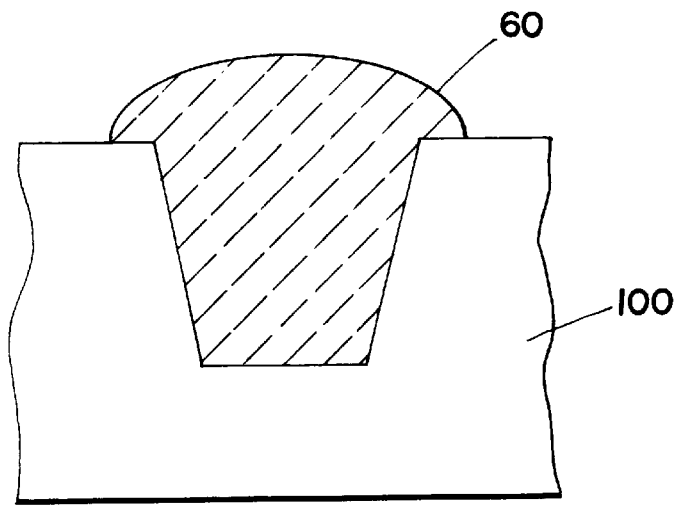
FIG. 6B illustrates in cross-section the dome-shaped cap that protects the corners of the trench.

The oxide shown above line 64 in FIG. 6A may also be removed with further etching, such as with a wet etchant of diluted 10:1 HF or diluted 100:1 HF solution. This etching step will result in the dome-shaped cap of FIG. 6B.

Figure 7:
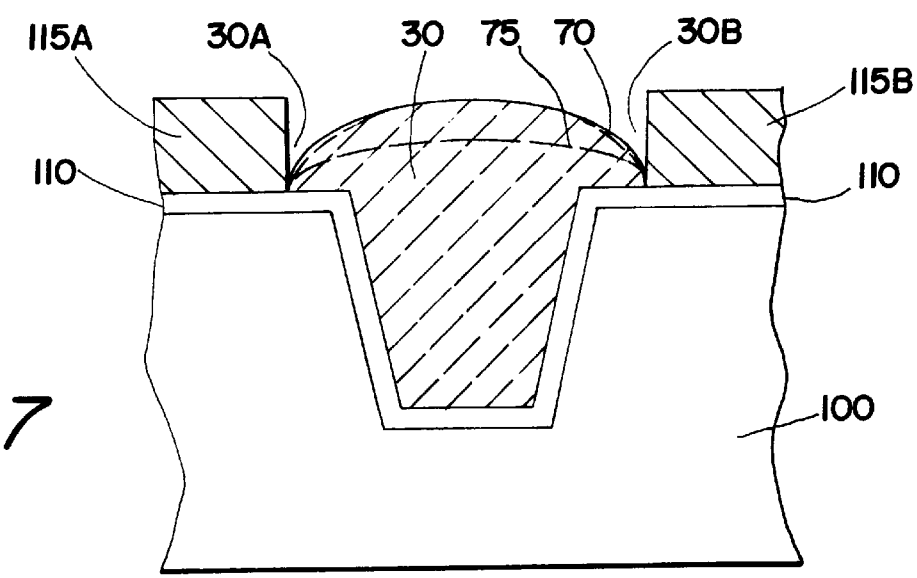
FIG. 7 illustrates an alternative embodiment for forming a structure with protected corners when oxide at interfaces is etched.
Figure 8:
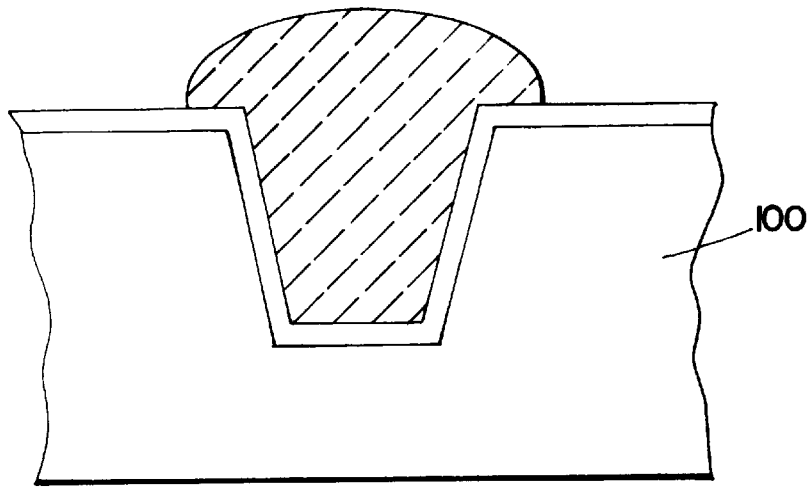
FIG. 8 is a cross-section of the structure shown in FIG. 7 after mask sections have been removed.
Figure 11:
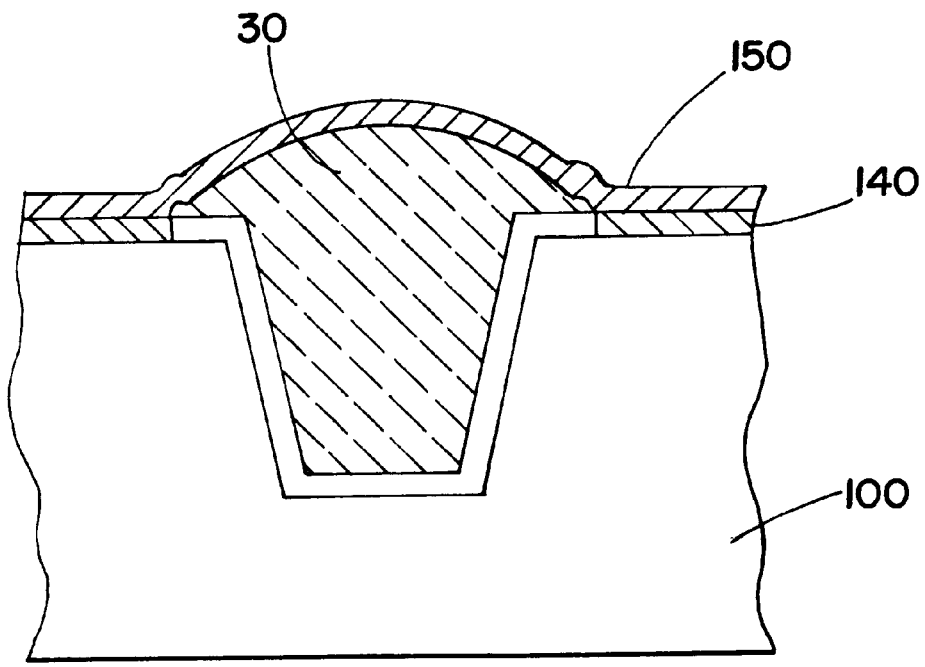
FIG. 11 is a cross-section of a structure that has a gate layer above the dome-shaped cap.

After obtaining the planarized oxide shown in FIG. 4, it is possible to form protected corners without immediately removing the nitride mask after planarization. The process for the alternative embodiments described below utilizes substantially the same process described previously in conjunction with FIGS. 1–4. The difference is that oxide layer 110 is preferably thinner—approximately 75Å–200Å— than the embodiments shown in FIGS. 1–4. As shown in FIG. 7, oxide on the sidewalls and at interface areas 30A and 30B is isotropically removed with a wet etchant such as diluted 100:1 HF. By removing oxide at the interfaces 30A and 30B, oxide 30 is provided with a positive slope on at least one side as shown in FIG. 7. As the oxide at the interface will etch faster than other areas of the oxide, rounded corners will be formed as shown in FIG. 7. One advantage of having a positive slope is that when layer 150 (as shown in FIG. 11) or any other layer is disposed on oxide 30, a reentrant profile is avoided. This permits better coverage of oxide 30 with layer 150. After rounding the corners of oxide 30 in FIG. 7, the nitride layer 115 in FIG. 7 is removed. Removal of nitride mask sections will also remove portions of oxide 110. As a result, the topography of the underlying oxide will be affected as generally shown in the intermediate structure of FIG. 8. Of course, the intermediate structure of FIG. 8 is not fully planarized.

Figure 8A:
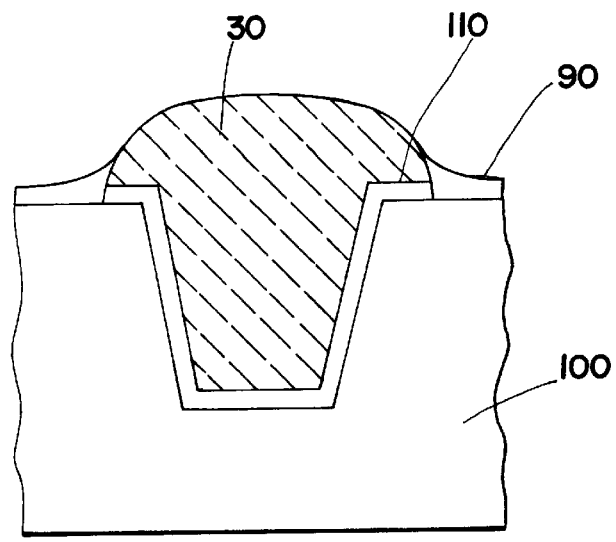
FIG. 8A illustrates the structure of FIG. 8 with a sacrificial gate oxide disposed thereon.
Figure 10:
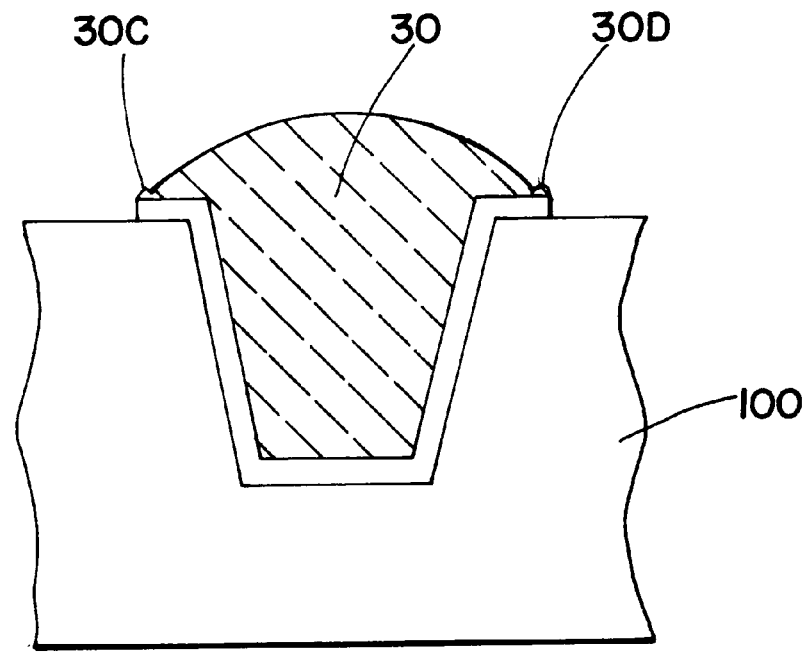
FIG. 10 illustrates in cross-section the dome-shaped cap that protects the corners of the trench.

The pad oxide 110 located beneath the mask sections in FIG. 7 is then completely removed using wet etching. During this wet etching process, the height of the trench oxide 30 is reduced to line 70. FIG. 8A illustrates a sacrificial gate oxide 90 that is thermally grown on the surface of silicon substrate 100 in the locations previously occupied by mask sections 115A and 115B. The sacrificial gate oxide is thereafter stripped to further reduce the height of oxide 30 to line 75. Due to the intersection of a deposited oxide 30 and a grown oxide 90, a kink will be formed at 30C and 30D in FIG. 10. As a consequence of stripping the sacrificial gate oxide, the dome-shaped oxide of FIG. 10 is formed. A gate oxide layer 140 is then thermally grown in areas adjacent to the trench oxide 30 as shown in FIG. 11.

Thereafter, one or more gate layers 150 are deposited above the gate oxide 140. For example, a polysilicon or polysilicide layer, or multiple layers of polysilicon and polysilicide, may comprise gate layer 150 to form the intermediate structure of FIG. 11. The gate layer is then patterned in a manner that is well-known in the art to form a gate.

Figure 9A:
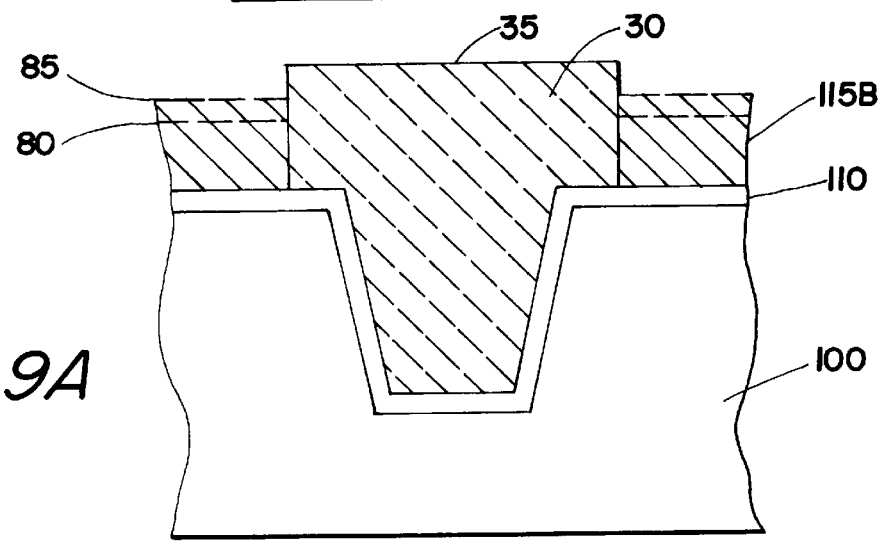
FIG. 9A illustrates an alternative embodiment for forming a protected corner while the mask sections are in place.
Figure 9B:
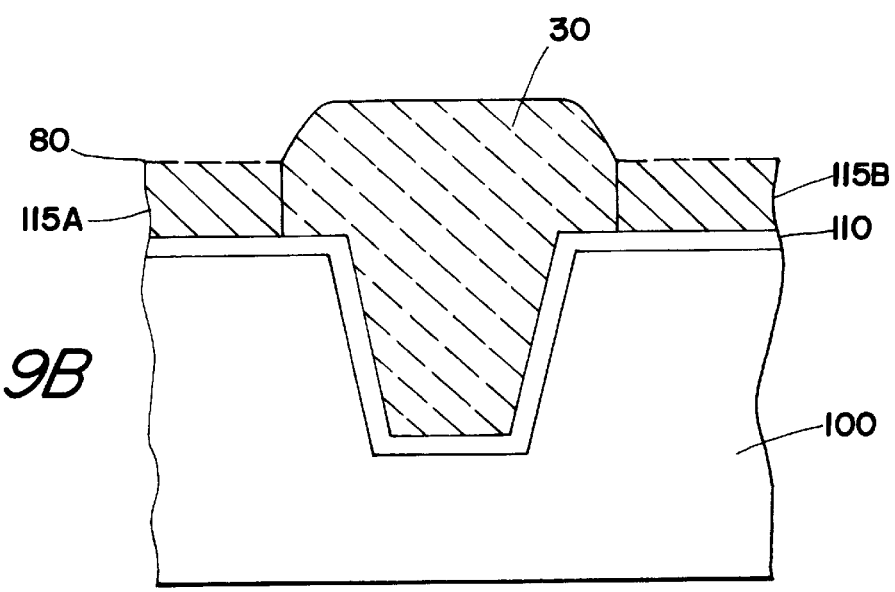
FIG. 9B illustrates a later step of the alternative embodiment of FIG. 9A.

Other alternate methods for forming protective corners are discussed below. A first alternate embodiment for creating the protective coating for the silicon corners involves combining a wet etch with a dry etch process. The dry etch would be performed after surface 35 of oxide 30 is planarized to be coplanar with mask sections 115A and 115B illustrated in FIG. 4. In this alternate embodiment, the nitride mask sections and oxide are wet etched with a faster nitride etch rate and a slower oxide etch rate (i.e., higher nitride-to-oxide selectivity). Due to the selectivity ratio, a significant portion of each mask section is removed in comparison to oxide 30. In particular, nitride is removed down to line 85 in FIG. 9A. The faster nitride etch rate is performed using a gas combination that includes argon, $CH_3F$ and $O_2$. The wet etch proceeds until the upper corners of oxide 30 are exposed at each side, as illustrated in FIG. 9A. Subsequently, a dry etch is performed. The dry etch step may comprise reactive ion etching with higher oxide-to-nitride selectivity to round the oxide corners and further reduce the height of oxide 30 down to line 80 to produce the structure shown in FIG. 9B. The higher oxide-to-nitride selectivity is achieved using a gas combination comprising CO, $C_4F_8$, argon and $O_2$. In place of $C_4F_8$, either $C_3F_8$ or $CHF_3$ may be fed into the plasma.

In a second alternate embodiment, dry etching of the mask sections 115A, 115B and oxide 30 is performed with a higher nitride-to-oxide selectivity until oxide 30 is exposed as shown in FIG. 9A. The dry etching will remove an upper portion of the nitride mask above line 85 in FIG. 9A and a portion of oxide 30. A second dry etch step is performed with opposite selectivity to produce the rounded oxide corners of FIG. 9B. The second dry etch step is performed with a gas combination consisting of CO, $C_4F_8$, argon and $O_2$ and may be used to impart a selectivity ratio wherein oxide is etched faster than nitride. Alternatively, the $C_4F_8$ may be replaced with either $C_3F_8$ or $CHF_3$.

After either the first or second alternate embodiment, mask sections 115A and 115B are stripped. Then an extended wet etch process using diluted 100:1 HF or diluted 10:1 HF is performed to remove oxide 110 beneath nitride mask sections 115A and 115B. After performing the extended wet etch process for 20–60 seconds the structure of FIG. 10 is obtained. Upon applying a gate layer, a structure as shown in FIG. 11 will be formed. Subsequent implantation steps, well-known in the art, may be performed to create doped regions and thus an integrated circuit.

We claim:

1. A method for forming a trench having a corner comprising the steps of:
   a) providing a cavity in a structure using a patterned layer as a mask;
   b) after step a) removing a portion of said patterned layer to expose a portion of a substrate adjacent at least one side of said cavity;
   c) filling said cavity with oxide;
   d) removing a remaining portion of said patterned layer; and
   e) removing a portion of said oxide to form a spacer adjacent said trench corner.

2. The method of claim 1, wherein after step c), said oxide is planarized.

3. The method of claim 2, wherein after planarization said oxide is coplanar with an upper surface of a remaining portion of said patterned layer.

4. The method of claim 1, wherein step b) comprises anisotropically etching said patterned layer to form a first sidewall substantially orthogonal to said substrate.

5. The method of claim 2, wherein step e) comprises etching oxide remaining to form a second sidewall, wherein said second sidewall is sloped.

6. The method of claim 5, wherein step e) comprises dry etching a portion of said oxide remaining.

7. The method of claim 6, wherein said sloped sidewall is further etched to form a dome-shaped cap overlapping said corner.

8. The method of claim 1, wherein a lateral dimension of approximately 500 to approximately 800 angstroms of said patterned layer is removed.

9. The method of claim 5, wherein a remaining portion of said patterned layer is removed before said second sidewall is formed.

10. A method for forming a trench having a corner comprising the steps of:
    a) providing a cavity in a structure using a patterned layer as a mask;
    b) after step a) removing a portion of said patterned layer to expose a portion of a substrate adjacent at least one side of said cavity;
    c) filling said cavity with oxide;
    d) reducing the thickness of said oxide to form a planarized oxide; and then
    e) removing a portion of said planarized oxide to protect said trench corner.

11. The method of claim 10, wherein step e) is performed before removing substantially all of said patterned layer from said substrate.

12. The method of claim 11, further comprising providing a gate layer after step e).

13. The method of claim 12, wherein step e) is performed with a dry etch.

14. The method of claim 12, wherein step e) is performed with a wet etch followed by a dry etch.

15. A method for forming a trench having a corner comprising the steps of:
   a) providing a cavity having a stepped portion in a structure;
   b) filing said cavity with oxide;
   c) removing a portion of said oxide to form a planarized oxide; and then
   d) removing a portion of said planarized oxide at an interface between said planarized oxide and an adjacent layer.

16. The method of claim 15, further comprising removing said adjacent layer.

17. The method of claim 16, further comprising wet etching a portion of said structure to remove a pad oxide overlying said structure.

18. The method of claim 17, further comprising dry etching said structure after wet etching to form a dome-shaped oxide.

* * * * *